United States Patent [19]

Meterko et al.

[11] Patent Number: 5,171,828
[45] Date of Patent: * Dec. 15, 1992

[54] COPOLYIMIDE ODPA/BPDA/4,4'-ODA OR P-PDA

[75] Inventors: Timothy A. Meterko, Buffalo; Rudolph F. Mundhenke, Tonawanda; Willis T. Schwartz, Grand Island, all of N.Y.

[73] Assignee: Occidental Chemical Corporation, Niagara Falls, N.Y.

[*] Notice: The portion of the term of this patent subsequent to Dec. 31, 2008 has been disclaimed.

[21] Appl. No.: 739,954

[22] Filed: Aug. 5, 1991

Related U.S. Application Data

[63] Continuation-in-part of Ser. No. 427,286, Oct. 26, 1989, Pat. No. 5,077,382.

[51] Int. Cl.$^5$ .................. C08G 69/26; C08G 8/02; C08G 73/10
[52] U.S. Cl. .................. 528/353; 528/125; 528/126; 528/128; 528/170; 528/171; 528/172; 528/173; 528/184; 528/185; 528/188; 528/220; 528/229; 528/350; 528/351; 525/432; 428/355; 428/343; 428/379; 428/458; 428/473.5
[58] Field of Search .............. 528/353, 125, 126, 128, 528/170, 171, 172, 173, 184, 185, 188, 220, 229, 350, 351; 525/432; 428/379, 343, 355, 458, 473.5

[56] References Cited

U.S. PATENT DOCUMENTS

| | | | |
|---|---|---|---|
| 2,710,853 | 6/1955 | Edwards et al. | 428/35.1 |
| 3,416,994 | 12/1968 | Chalmers et al. | 428/473.5 |
| 3,520,837 | 7/1970 | Wilson | 521/128 |
| 3,528,950 | 9/1970 | Rogers | 528/229 |
| 3,959,350 | 5/1976 | Lubowitz | 528/353 |
| 4,063,993 | 12/1977 | Burns | 156/17 |
| 4,247,443 | 1/1981 | Sasaki et al. | 528/183 |
| 4,290,936 | 9/1981 | Sasaki et al. | 528/183 |
| 4,537,947 | 8/1985 | D'Alelio | 525/424 |
| 5,077,382 | 12/1991 | Meterko et al. | 528/188 |

FOREIGN PATENT DOCUMENTS 63-264121 11/1988 Japan .

Primary Examiner—Morton Foelak
Assistant Examiner—P. Hampton-Hightower
Attorney, Agent, or Firm—Wayne A. Jones; Richard D. Fuerle

[57] ABSTRACT

Polyimide copolymers are disclosed having the recurring structure

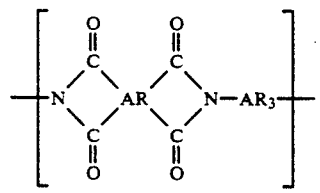

wherein AR is $AR_1$ or $AR_2$, wherein $AR_1$ is

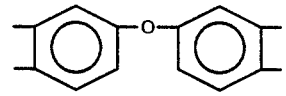

and wherein $AR_2$ is

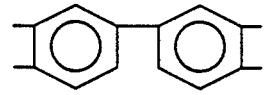

provided that the molar ratio of $AR_1$ to $AR_2$ is 3:1 to 1:3, and wherein $AR_3$ is

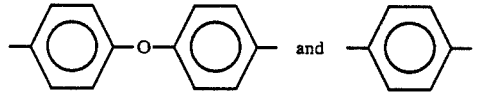

These polyimides have unexpected properties which are useful in various electronic applications.

24 Claims, No Drawings

COPOLYIMIDE ODPA/BPDA/4,4'-ODA OR P-PDA

This invention is a continuation-in-part of U.S. Ser. No. 07/427,286, filed Oct. 26, 1989, copending herewith, now U.S. Pat. No. 5,077,382.

BACKGROUND OF THE INVENTION

This invention relates to polyimide copolymers prepared by reacting a mixture of dianhydrides with a diamine. More specifically, it relates to polyimide copolymers prepared from a mixture of 4,4'-oxydiphthalic anhydride (ODPA) and 3,4,3',4'-biphenyltetracarboxylic dianhydride (BPDA) and either 4,4'-oxydianiline (ODA) or p-phenylenediamine (p-PDA).

Dianhydrides, such as ODPA, can be reacted with diamines to form polyimide resins. The formation of the polymer is a two step process. In the first step, the dianhydride reacts with the diamine to form a polyamic acid which generally remains in solution. The polyamic acid solution is then subjected to a curing process that includes heat. The solvent evaporates, and the polyamic acid releases water to form the final polyimide. Chemical methods of curing are also available.

There are several methods for forming objects from polyimides. For example, the polyamic acid solution can be spread on a surface and cured to form a film. The surface need not be flat. Alternatively, the polyamic acid solution can be cured to form the polyimide which can then be subjected to heat and pressure to form objects.

Polyimides were first prepared by T. M. Bogert et al. J. Am. Chem. Soc. (1908) 30, 1140. U.S. Pat. No. 2,710,853 discloses polyimides based upon pyromellitic acid. Polyimides based upon BPDA are disclosed in U.S. Pat. No. 4,247,443. The use of both BPDA and ODA in the preparation of polyimide polymers is disclosed in U.S. Pat. No. 4,290,936. Tim Tanunina, et al [Plast. Massy (9) 45-7, 1975 (in Russian)], describe polyimide copolymers prepared from 4,4'-diaminodiphenyl ether (ODA) and pairs of the following dianhydrides, pyromellitic dianhydrides (I); 3,3',4,4'-tetracarboxydiphenyl oxide (II); 3,3',4,4'-benzophenone tetracarboxylic acid (III); and 3,3',4,4'-diphenylsulfide tetracarboxylic acid (IV). The pairs of dianhydrides studied were II and III, I and II, and III and IV. The article discusses the glass transition temperature and densities of the copolymers formed, and compares them to the characteristics of homopolyimides.

Japanese Patent number SHO 63 [1988]-264121 discloses gas separation membranes prepared from polyimide polymers. The polyimides in question are copolymers containing ODPA and BPDA coupled with a variety of diamines, including ODA and para-phenylenediamine.

U.S. Pat. No. 3,416,994 discloses cross-linking polyimides and a process for producing them that comprises reacting a diamine and a dianhydride of a tetracarboxylic acid, the diamine or diester containing an aromatic keto group, and the diamine being present in an amount of at least 15% molar excess.

U.S. Pat. No. 3,520,837 discloses a method for making a polyimide foam from a tetracarboxylic acid ditertiary amine reaction product and an aromatic diamine in aqueous solution.

U.S. Pat. No. 3,528,950 discloses rapid-curing stable polyimides prepared by heating polyimide prepolymers having a specific terminal or endcapping chemical groups. The endcapping compounds are mono anhydrides that contain a double bond and become reactive at temperatures of about 200° to 350° C. A typical endcapping agent is 3,6-endomethylene-1,2,3,6-tetrahydrophthalic anhydride.

U.S. Pat. No. 3,959,350 discloses melt fusible linear polyimides of aromatic primary diamines such as paradiamino benzene with 2,2-bis(3,4-dicarboxyphenyl)-hexafluoropropane dianhydride. In the preferred embodiment for extrusion and injection molding, a polyimide is characterized by amine end groups that are end capped with phthalic anhydride.

U.S. Pat. No. 4,537,947 discloses aromatic polyimides with various functional end groups such as —CH=CH$_2$, —C≡CH, —CN and —CHO that are chain-extended (molecular weight increased) by reacting the functional groups with aromatic bis-dipoles. A representative bis-dipole is 1,4-benzene-dinitrile oxide. These polyimides can be shaped and formed prior to chain extending. The aromatic polyimides appropriate for chain-extending are formed by the reaction of aromatic dianhydrides, with aromatic amines and monoamines that contain the functional groups.

Polyimides are used for wire insulation in certain specialized applications such as aircraft and spacecraft. Polyimides are also used in tape automated bonding (TAB) of semiconductor devices. In TAB semiconductor packaging, a thin sheet of copper is bonded to a polyimide film. The copper is etched to form leads and the semiconductor is then attached to the polyimide film. The leads on the TAB film may then be attached to the semiconductor. The TAB technology allows each chip to have a greater number of leads, and to be connected to the circuit board without having to drill holes through the board. In addition, TAB chips require less vertical space than conventional chips, and therefore, allow more compact circuitry. U.S. Pat. No. 4,063,993 discloses specific methods for bonding semiconductor leads to a tape and also discloses the use of polyimides as the basis of such a tape.

SUMMARY OF THE INVENTION

Polyimide copolymers of the following formula are disclosed:

The first is a copolyimide of the recurring structure

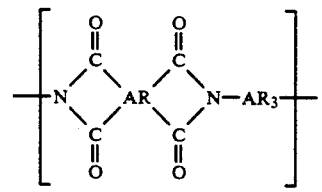

wherein AR is either AR$_1$ or AR$_2$, wherein AR$_1$ is represented by the following formula:

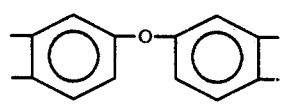

and wherein AR$_2$ is represented by the following formula:

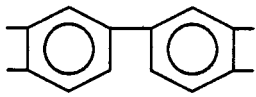

provided that the molar ratio between AR$_1$ and AR$_2$ is in the range from 3:1 to 1:3, and wherein AR$_3$ is selected from the group consisting of

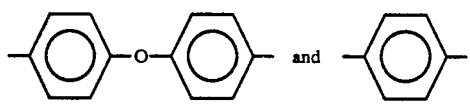

These polyimides have unexpected properties which are useful in various electronic applications.

DETAILED DESCRIPTION OF THE INVENTION

The copolyimides of this invention are formed from ODA or p-phenylene diamine as the amine component and a mixture of ODPA and BPDA as the anhydride component. The copolyimides of this invention are prepared with a single diamine component. This diamine can be either ODA or para-phenylene diamine.

Such copolymers can be formed by the following method. Mixtures of ODPA in BPDA can be reacted with a diamine to form polyamic acids which are then imidized to form polyimide copolymers. The copolyimides that are the subject of this invention can be prepared with dianhydrides in the following range of molar values:

| ODPA | BPDA |
|------|------|
| 0.75 | 0.25 |
| 0.50 | 0.50 |
| 0.25 | 0.75 |

In most cases, equimolar amounts of diamine and dianhydride are used. If equimolar amounts of diamine and dianhydride are used, the polymerization process continues without inhibition, and no endcapping reagents of any sort are used. This is the preferred embodiment for this invention. Occasionally, it is desirable to prevent the polyamic acid from becoming too viscous. Control of viscosity may be accomplished by using a slight excess of the diamine and using an acid anhydride i.e., a monoanhydride such as phthalic anhydride, as an end capping reagent or using a slight excess of the dianhydride and using a monoamine as an endcapping reagent. Since the purpose of endcapping is to prevent the polymer from becoming too viscous by limiting molecular weight growth, it is important to select un-reactive endcapping reagents, that is, endcapping reagents that, after the reaction with the polymer chain, will not readily undergo polymerization or chain extension. The use of such un-reactive endcapping reagents produces polymers that are not suitable for either chain extension or chain cross-linking. Accordingly, endcapping reagents that contain end groups such as —CH=CH$_2$, —C≡CH, —CN, and —CHO or any other group that, without further chemical processing, could undergo chain extension or cross-linking during imidization or formation of articles from this polymer, are not usable in the practice of this invention. On the other hand, endcapping reagents that have the mono-amine or mono-anhydride functionality attached to an aromatic or aliphatic molecule without readily polymerizable or cross-linkable substituents are suitable. Any substituent on the aliphatic or aromatic group that is not susceptible to chain extension or cross-linking, such as halo, is suitable. As used herein, the term "unreactive endcap" shall mean an endcap that does not readily undergo chain extension or cross-linking reactions. Such endcaps are produced through the use of a non-reactive endcapping reagent. Examples of anhydrides that may be used as endcapping reagents are succinic anhydride, glutaric anhydride, phthalic anhydride, halophthalic anhydride, alkylphthalic anhydrides, alkoxyphthalic anhydrides, arylphthalic anhydrides, and anhydrides of naphthalene dioic acids that can form cyclic anhydrides, such as 1,8-naphthalenedioic anhydride, and 2,3-naphthalenedioic anhydride. Examples of amines that can be used as endcapping reagents are monoamines such as aniline, toluidines, anisidines, and other alkyl or alkoxy anilines, aminobiphenyl, aminobenzophenone, aminodiphenylsulfone, monoaminobenzotrifluorides, naphthalamines, and other aminoaromatic monoalkyls. Aliphatic amines can also be used; however, they are not preferred since the alkyl endcap molecules tend to have less thermal stability than those with aromatic endcaps.

In the first step of the reaction, a mixture of dianhydrides is added to a single diamine in a dipolar aprotic solvent. Illustrative of the dipolar aprotic solvents that can be used are dimethyl acetamide, dimethyl formamide, dimethyl sulfoxide, hexamethylphosphoramide, N-methylpyrrolidone, and 1,3-dimethyl-2-imidazolidinone. The preferred solvent is dimethyl acetamide. The reaction between the diamine and the dianhydride is normally conducted at room temperature with stirring. Occasionally, slight warming is used to speed up the reaction.

At this stage of the reaction, the product is a polyamic acid. The inherent viscosity of the polyamic acid solution is measured. Inherent viscosity is determined by measuring the viscosity of a 0.5% solution using a capillary viscometer. This viscosity is an indirect measure of the molecular weight of the polymer and, therefore, the extent of polymerization.

The polyamic acids are poured into the desired form. For example, the polyamic acid solution can be spread on a plate. Finally, the polyamic acid is subjected to curing. The initial step in curing is running a stream of an inert gas, such as nitrogen, over the formed polyamic acid in order to evaporate some of the solvent. When the formed polyamic acid is tack-free, it is heated gradually from room temperature up to a maximum temperature of 400° C. The temperature rise can be interrupted at intermediate temperatures and the object held at a given temperature before the temperature is allowed to increase to the maximum temperature. The preferred method is to allow the temperature to rise to 100° C., hold it at that temperature for one hour, allow the temperature to rise to 200° C., and hold it there for an hour, and, finally, to allow the temperature to rise to 300° C. or greater depending on the Tg of the fully imidized resin, and hold it at that temperature for an hour. There are three major changes that take place during the curing process. Most of the remainder of the solvent is lost, the polyamic acid releases water to form a polyimide, and through equilibration of the amide groups of the existing polyamic acids, chain extension takes place.

Alternatively, chemical imidization can be accomplished using methods such as that described by M. L. Wallach [Journal of Polymer Science, Part A-2; Vol. 6, 953-960 (1968)]. In this method the polyamic acid is heated with a mixture of an acid anhydride, such as acetic anhydride, and a tertiary amine, such as pyridine, as a basic catalyst. Wallach states that this method should yield a polyimide film that is essentially the same molecular weight as the polyamic acid. Other chemical imidization methods, similar to that disclosed by Wallach, can also be used.

One important property of the polyimides of this invention is their high comparative tracking index. The comparative tracking index is measured by a standard method (ASTM D 3638-77, which is incorporated herein by reference). In summary, the method involves placing electrodes on the material to be tested and adding one drop per second of an aqueous electrolyte solution between the electrodes. The test apparatus is designed to cause tracking, that is, the formation of carbonaceous paths or tracks near the electrodes. When these tracks are sufficiently established to conduct appreciable current, the material is said to have failed. The numerical value of the highest voltage at which no failure occurs with the application of fifty or more drops electrolyte is arbitrarily called the comparative tracking index. This method is an accelerated test which, at relatively low test voltages, provides comparison of the performance of insulating materials under wet and contaminated conditions. The polyimides of this invention have unexpectedly high comparative tracking indexes.

The polyimides of this invention have good electrical properties and, accordingly, can be used as insulating material. The preferred method of using the polyimides of this invention as insulators is to coat the electrically conductive object with the polyamic acid solution and cure the composition directly on the object to be insulated. By this means, the insulating layer of polyimide forms directly on the object to be insulated. The object to be insulated can be of any shape. For example, round wires, flat conductors, conductive sheets, circuit boards and semiconductor circuit chips can be insulated using the copolyimides of this invention. Even objects of irregular shape can be insulated using these materials. Obviously, only those materials that can withstand the curing process can be insulated using the copolyimides of this invention.

Another property of the polyimides of this invention is their tensile modulus. To measure the modulus, a sample of the plastic is subjected to stress. The tensile modulus is defined as the slope of the initial linear portion of the load extension response (stress strain) wave.

The polyimides of this invention are also useful as a plastic base material for use in tape automated bonding (TAB) electrical chip packaging. Such tape generally consists of a conductive layer and a non-conductive layer. The conductive layer is generally copper. Polyimides are frequently used as the non-conductive layer. A polyimide can be attached to copper with an adhesive. In some applications, the adhesive is not used. In preparing the final product, the conductive layer is etched to form leads and the semiconductor device is attached to these leads. Finally, the semiconductor device is encapsulated in a suitable resin.

EXAMPLE 1

8.00 g (0.04 moles) of 4,4'-oxydianiline (ODA) was dissolved in 113.8 g of dimethyl acetamide. To the resulting solution was added a mixture of 6.204 g (0.02 moles) of ODPA and 5.884 g (0.02 moles) of BPDA. The mixture was stirred at room temperature for 3.5 hours and allowed to stand overnight. The inherent viscosity of the resulting polyamic acid solution (diluted to 0.5%) was 0.993. The polyamic acid solution was cast on glass plates using a doctor blade set at 20 mil. The films on the plates were dried under a stream of nitrogen gas until they were tack-free. The coated plates were then heated to 100° C. for one hour, 200° C. for one hour, and 300° C. for one hour. The product was a polyimide film. The glass transition temperature of this polyimide was 235° C. The comparative tracking index, measured by the ASTM method cited above, was 200 volts.

EXAMPLE 2

16.22 (0.15 moles) of p-phenylene diamine were dissolved in 352 g of dimethyl acetamide. A mixture of 11.03 g (0.0375 moles) of BPDA and 34.89 g (0.1125 moles) of ODPA was added to the solution. The procedure of Example 1 was followed to produce a polyimide film. The comparative tracking index, as measured by the ASTM method, was 125 volts, the tensile modulus was 869,300 psi, and the dielectric constant was 3.50 at 1 kHz.

EXAMPLE 3

25.025 g (0.125 moles) of ODA were dissolved in 358 grams of dimethyl acetamide. A mixture of 9.179 g (0.0312 moles) of BPDA and 29.066 g (0.0937 moles) of oxydiphthalic dianhydride was added to the solution. The procedure of Example 1 was followed to produce the polyimide film. The comparative tracking index, as measured by the ASTM method, was 150 volts, the glass transition point was 260° C., the tensile modulus was 576,500 psi, and the dielectric constant was 3.64 at 1 kHz.

EXAMPLE 4

25.025 g (0.125 moles) of ODA were dissolved in 356 grams of dimethyl acetamide. A mixture of 18.39 g (0.0625 moles) of BPDA and 19.39 g (0.0625 moles) of ODPA were added to the solution. The procedure of Example 1 was followed to produce a polyimide film. The comparative tracking index, as measured by the ASTM method, was 150 volts, the glass transition temperature was 265° C., the tensile modulus was 543,700 psi, and the dielectric constant was 3.55 at 1 kHz.

EXAMPLE 5

25.025 g (0.125 moles) of ODA were dissolved in 353 grams of dimethyl acetamide. A mixture of 27.57 g (0.0937 moles) of BPDA and 9.678 g (0.0312 moles) of ODPA was added to the solution. The procedure of Example 1 was followed to produce a polyimide film. The comparative tracking index, as measured by the ASTM method, was 150 volts, the glass transition temperature was 270° C., the tensile modulus was 599,300 psi, and the dielectric constant was 3.48 at 1 kHz.

EXAMPLE 6

16.34 g (0.1511 moles) of p-phenylene diamine were dissolved in 348 g of dimethyl acetamide. A mixture of 33.10 g (0.1125 moles) of BPDA, 1.63 g (0.0375 moles) of ODPA, and 0.33 g (0.0022 moles) of phthalic anhydride was added to the solution The procedure of Example 1 was followed to produce a polyimide film The

We claim:
1. A copolyimide having the recurring structure

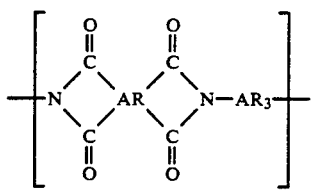

wherein AR is AR₁ or AR₂, wherein AR₁ is

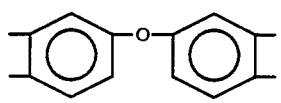

and wherein AR₂ is

provided that the molar ratio of AR₁ to AR₂ is 3:1 to 1:3 and wherein AR₃ is selected from the group consisting of

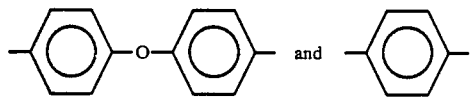

provided that no endcapping reagent is used in the preparation of the polymer.

2. A copolyimide according to claim 1 in which the molar ratio of AR₁ to AR₂ is 2:1 to 1:2.

3. A copolyimide according to claim 1 in which the molar ratio of AR₁ to AR₂ is 1.5:1 to 1:1.5.

4. A copolyimide according to claim 1 in which the molar ratio of AR₁ to AR₂ is 1:1.

5. An article comprising an electrically conductive material coated with a copolyimide according to claim 1.

6. An article comprising an electrically conductive material coated with a copolyimide according to claim 2.

7. An article comprising an electrically conductive material coated with a copolyimide according to claim 3.

8. An article comprising an electrically conductive material coated with a copolyimide according to claim 4.

9. An article in the form of a tape comprising an electrically conductive layer which may be fashioned into electrically conductive leads suitable for attachment to a semiconductor device, a layer of a copolyimide according to claim 1, and optional bonding materials between said layers.

10. An article in the form of a tape comprising an electrically conductive layer which may be fashioned into electrically conductive leads suitable for attachment to a semiconductor device, a layer of a copolyimide according to claim 2, and optional bonding materials between said layers.

11. An article in the form of a tape comprising an electrically conductive layer which may be fashioned into electrically conductive leads suitable for attachment to a semiconductor device, a layer of a copolyimide according to claim 3, and optional bonding materials between said layers.

12. An article in the form of a tape comprising an electrically conductive layer which may be fashioned into electrically conductive leads suitable for attachment to a semiconductor device, a layer of a copolyimide according to claim 4, and optional bonding materials between said layers.

13. A copolyimide having the recurring structure

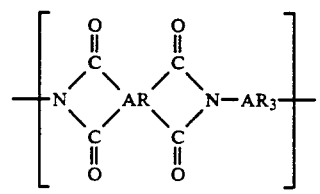

wherein AR is either AR₁ or AR₂, wherein AR₁ is

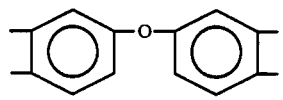

and wherein AR₂ is

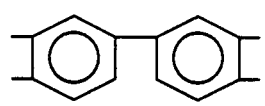

provided that the molar ratio of AR₁ to AR₂ is 3:1 to 1:3, and wherein AR₃ is selected from the group consisting of

terminated by an unreactive endcap.

14. A copolyimide according to claim 13 in which the molar ratio of AR₁ to AR₂ is 2:1 to 1:2.

15. A copolyimide according to claim 13 in which the molar ratio of AR₁ to AR₂ is 1.5:1 to 1:1.5.

16. A copolyimide according to claim 13 in which the molar ratio of AR₁ to AR₂ is 1:1.

17. An article comprising an electrically conductive material coated with a copolyimide according to claim 13.

18. An article comprising an electrically conductive material coated with a copolyimide according to claim 14.

19. An article comprising an electrically conductive material coated with a copolyimide according to claim 15.

20. An article comprising an electrically conductive material coated with a copolyimide according to claim 16.

21. An article in the form of a tape comprising an electrically conductive layer which may be fashioned into electrically conductive leads suitable for attachment to a semiconductor device, a layer of a copolyimide according to claim 13, and optionally bonding materials between said layers.

22. An article in the form of a tape comprising an electrically conductive layer which may be fashioned into electrically conductive leads suitable for attachment to a semiconductor device, a layer of a copolyimide according to claim 14, and optional bonding materials between said layers.

23. An article in the form of a tape comprising an electrically conductive layer which may be fashioned into electrically conductive leads suitable for attachment to a semiconductor device, a layer of a copolyimide according to claim 15, and optional bonding materials between said layers.

24. An article in the form of a tape comprising an electrically conductive layer which may be fashioned into electrically conductive leads suitable for attachment to a semiconductor device, a layers of the copolyimide according to claim 16, and optional bonding materials between said layers.

* * * * *